United States Patent
Yu et al.

(10) Patent No.: US 9,806,064 B2
(45) Date of Patent: Oct. 31, 2017

(54) PACKAGE WITH MULTIPLE PLANE I/O STRUCTURE

(71) Applicant: Taiwan Semiconductor Manufacturing Company, Ltd., Hsin-Chu (TW)

(72) Inventors: Hung-Chang Yu, Hsin-Chu (TW); Kai-Chun Lin, Hsin-Chu (TW); Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/071,920

(22) Filed: Mar. 16, 2016

(65) Prior Publication Data
US 2016/0197060 A1    Jul. 7, 2016

Related U.S. Application Data

(63) Continuation of application No. 14/144,813, filed on Dec. 31, 2013, now Pat. No. 9,299,677.

(51) Int. Cl.
*H01L 29/80* (2006.01)
*H01L 25/065* (2006.01)
(Continued)

(52) U.S. Cl.
CPC .......... *H01L 25/0657* (2013.01); *H01L 21/56* (2013.01); *H01L 21/565* (2013.01);
(Continued)

(58) Field of Classification Search
CPC ... H01L 25/0657; H01L 21/56; H01L 21/565; H01L 23/3107; H01L 23/49816; H01L 23/49833; H01L 23/49838; H01L 24/17; H01L 24/81; H01L 25/065; H01L 25/50; H01L 21/2007; H01L 21/76251; H01L 23/49513; H01L 21/82; H01L 23/3128; H01L 24/05; H01L 24/13; H01L 2224/0401; H01L 2224/05552; H01L 2224/05556; H01L 2224/06181; H01L 2224/09181; H01L 2224/131; H01L 2224/16055; H01L 2224/16145; H01L 2224/16225; H01L 2224/16227; H01L 2224/1712; H01L 2224/17179; H01L 2224/17181; H01L 2224/75702;
(Continued)

(56) References Cited

U.S. PATENT DOCUMENTS

6,590,282 B1 *  7/2003  Wang .................. H01L 25/0657
                                              257/685
6,864,565 B1    3/2005  Hool et al.
(Continued)

*Primary Examiner* — Yosef Gebreyesus
(74) *Attorney, Agent, or Firm* — Slater Matsil, LLP (57) ABSTRACT

A embodiment package includes a three dimensional integrated circuit (3D IC) with first input/output pads on a first side and second input/output pads on a second side, a first fan out structure electrically coupled to the first input/output pads on the first side of the three dimensional integrated circuit, and a second fan out structure electrically coupled to the second input/output pads on the second side of the three dimensional integrated circuit.

20 Claims, 4 Drawing Sheets

(51) Int. Cl.
*H01L 23/00* (2006.01)
*H01L 23/498* (2006.01)
*H01L 21/56* (2006.01)
*H01L 23/31* (2006.01)
*H01L 25/00* (2006.01)

(52) U.S. Cl.
CPC ...... *H01L 23/3107* (2013.01); *H01L 23/3128* (2013.01); *H01L 23/49816* (2013.01); *H01L 23/49833* (2013.01); *H01L 23/49838* (2013.01); *H01L 24/17* (2013.01); *H01L 24/81* (2013.01); *H01L 25/065* (2013.01); *H01L 25/50* (2013.01); *H01L 24/05* (2013.01); *H01L 24/13* (2013.01); *H01L 24/16* (2013.01); *H01L 2224/0401* (2013.01); *H01L 2224/05552* (2013.01); *H01L 2224/05554* (2013.01); *H01L 2224/06181* (2013.01); *H01L 2224/09181* (2013.01); *H01L 2224/131* (2013.01); *H01L 2224/16055* (2013.01); *H01L 2224/16057* (2013.01); *H01L 2224/16145* (2013.01); *H01L 2224/16225* (2013.01); *H01L 2224/16227* (2013.01); *H01L 2224/1712* (2013.01); *H01L 2224/17179* (2013.01); *H01L 2224/17181* (2013.01); *H01L 2224/75702* (2013.01); *H01L 2224/81191* (2013.01); *H01L 2224/81801* (2013.01); *H01L 2224/81815* (2013.01); *H01L 2224/9202* (2013.01); *H01L 2225/06517* (2013.01); *H01L 2225/06582* (2013.01); *H01L 2924/15311* (2013.01); *H01L 2924/15321* (2013.01); *H01L 2924/15331* (2013.01); *H01L 2924/181* (2013.01)

(58) Field of Classification Search
CPC . H01L 2224/81191; H01L 2224/81801; H01L 2224/81815; H01L 2224/9202
See application file for complete search history.

(56) References Cited

U.S. PATENT DOCUMENTS

| | | | |
|---|---|---|---|
| 7,531,905 B2 * | 5/2009 | Ishino | H01L 24/73 257/686 |
| 8,546,930 B2 † | 10/2013 | Bakir | |
| 2004/0070083 A1 * | 4/2004 | Su | H01L 25/0657 257/778 |
| 2008/0105984 A1 * | 5/2008 | Lee | H01L 23/3128 257/777 |
| 2008/0284037 A1 * | 11/2008 | Andry | H01L 21/6835 257/774 |
| 2009/0302435 A1 * | 12/2009 | Pagaila | H01L 21/561 257/659 |
| 2010/0109142 A1 * | 5/2010 | Toh | H01L 21/486 257/690 |
| 2010/0187683 A1 * | 7/2010 | Bakir | H01L 23/3677 257/713 |
| 2011/0215470 A1 * | 9/2011 | Chen | H01L 23/52 257/738 |
| 2011/0241194 A1 | 10/2011 | Chen et al. | |
| 2012/0032340 A1 * | 2/2012 | Choi | H01L 21/561 257/774 |
| 2012/0248439 A1 * | 10/2012 | Lee | H01L 23/49838 257/48 |
| 2014/0252632 A1 | 9/2014 | Barth et al. | |

\* cited by examiner
† cited by third party

PACKAGE WITH MULTIPLE PLANE I/O STRUCTURE

This application is a continuation of and claims priority to U.S. patent application Ser. No. 14/144,813, filed on Dec. 31, 2013, entitled "Package with Multiple Plane I/O Structure," which application is hereby incorporated herein by reference

BACKGROUND

As the demand for smaller electronic products grows, manufacturers and others in the electronics industry continue to seek ways to reduce the size of the integrated circuits (ICs) used in the electronic products. In pursuit of that goal, three-dimensional (3D) type integrated circuit packaging techniques have been developed and used to produce three dimensional integrated circuits, or simply 3D ICs. Each 3D IC includes two or more chips stacked one on top of another and integrated both vertically and horizontally to generate a single circuit.

Because of the three dimensional structure of the 3D IC, the footprint of the stacked chips may be considerably smaller than the footprint of a conventional single layer chip. In other words, when viewed from above or below, the overall size of the stacked chips in the 3D IC may be smaller than the size of the conventional chip. However, due to the smaller footprint offered by the stacked chips in the 3D IC, it can be difficult for the 3D IC to contain all of the input/output (I/O) pads desired for a package.

Another way that the electronics industry is attempting to reduce the size of integrated circuits is by utilizing "flip chip" packaging. Flip chip microelectronic assembly is the direct electrical connection of face-down (hence, "flipped") electronic components onto substrates, circuit boards, another chip, wafer or carriers using conductive solder bumps on the chip bond pads.

In a typical flip chip assembly process, integrated circuits are created on a wafer. Thereafter, pads on a top surface of the integrated circuits are metalized. Next, conductive solder balls (i.e., dots or bumps) are deposited on the pads and the integrated circuits on the wafer are separated or cut from each other to form individual chips. Thereafter, each chip is "flipped" over and positioned so that the solder balls of the chip are aligned with mating connectors on the underlying external circuitry. Finally, the solder balls are re-melted and the mounted chip is under-filled using an electrically-insulating adhesive in order to complete the conventional flip-chip package.

In some cases, one of the 3D ICs described above is utilized in the fabrication of a flip chip package. To ensure that such a 3D IC package has a pitch suitable for larger, thicker printed circuit boards (PBCs), an interposer, substrate, or other suitable structure may be attached to one side of the 3D IC in order to fan out (a.k.a., bond out) the I/O pad of the 3D IC.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a three dimensional (3D) integrated circuit (IC) flip-chip style package. The concepts in the disclosure may also apply, however, to other types of packages, semiconductor structures, or circuits.

Figure 1:
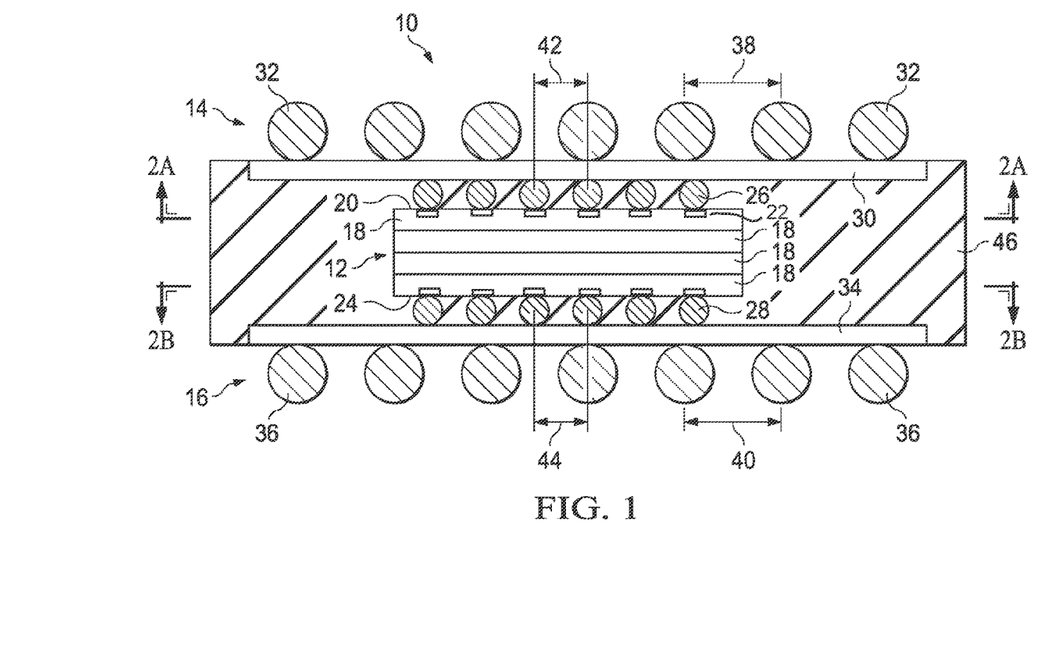
FIG. 1 illustrates an embodiment three dimensional (3D) integrated circuit (IC) flip-chip style package.

Referring to FIG. 1, a three dimensional integrated circuit (3D IC) flip-chip style package 10 is illustrated. As will be more fully explained below, the package 10 provides numerous benefits and advantages. For example, the package 10 includes input/output connections on two different planes (e.g., the top and the bottom). In addition, even though the three dimensional integrated circuit within the package 10 offers only a small area for input/output connections, the two-sided configuration effectively doubles the number of input/output connections that can be formed on the three dimensional integrated circuit and utilized by the package.

As shown in FIG. 1, an embodiment package 10 generally includes a three dimensional integrated circuit 12, a first fan out structure 14, and a second fan out structure 16. In an embodiment, the three dimensional integrated circuit 12 includes a plurality of planar chips 18 (a.k.a., dies, integrated circuits, etc.) stacked upon each other. The chips 18 may have been singulated from a single wafer or a variety of different wafers prior to being stacked together.

The various chips 18 in the three dimensional integrated circuit 12 may include one or more of the following components: a logic device, a processor, a microprocessor, a memory (e.g., static random access memory (SRAM), etc.), an analog device, a digital device, an active device, a passive device, an antenna, a transmitter, a receiver, and so on. Notably, each chip 18 in the three dimensional integrated circuit 12 may utilize a single component, multiple similar components, or combinations of different components.

In an embodiment, the three dimensional integrated circuit 12 is both horizontally and vertically integrated. As such, the various components in one chip 18 may communication with the other components of that same chip 18 as well as with the components of neighboring chips 18 in other layers of the three dimensional integrated circuit 12. To facilitate this communication between chips 18 of various layers, the three dimensional integrated circuit 12 may include vias, metallization, electrical connections, and so on.

While the stacked chips 18 of three dimensional integrated circuit 12 shown in FIG. 1 are generally vertically aligned, one or more of the chips 18 in the three dimensional integrated circuit 12 may be misaligned with a neighboring chip or chips 18 such that the three dimensional integrated circuit 12 includes an overhang. Likewise, while each of the chips 18 in the three dimensional integrated circuit 12 of FIG. 1 has the same size, the chips 18 of different layers may be of various sizes, with different widths, thicknesses, and so on. Moreover, while four of the chips 18 are depicted in FIG. 1, it should be recognized that more or fewer of the chips 18 may be included in the three dimensional integrated circuit 12 in practical applications.

Figure 2A:
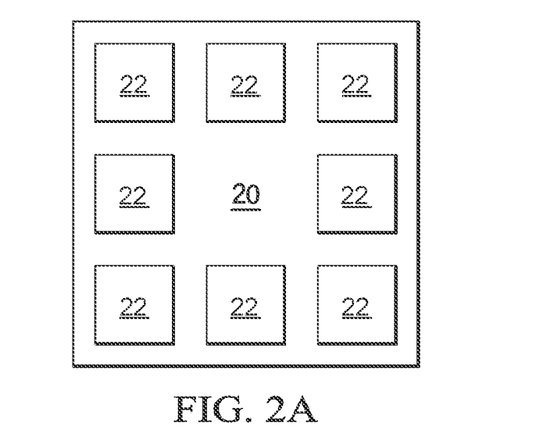
FIG. 2A illustrates input/output (I/O) pads on a top surface of the package of FIG. 1.
Figure 2B:
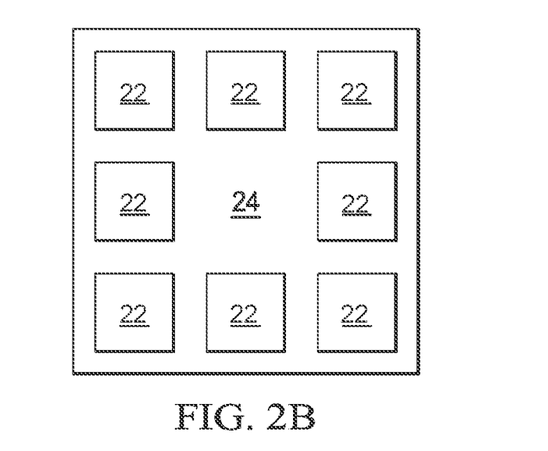
FIG. 2B illustrates input/output (I/O) pads a bottom surface of the package of FIG. 1.

As shown in FIG. 2A, which is a cross section of the three dimensional integrated circuit 12 alone taken generally along line 2A-2A, the three dimensional integrated circuit 12 has a top surface 20 defining a front plane. As shown, the top surface 20 includes several input/output (I/O) pads 22. As shown in FIG. 2B, which is a cross section of the three dimensional integrated circuit 12 alone taken generally along line 2B-2B, the three dimensional integrated circuit 12 has a bottom surface 24 defining a back plane or reverse plane. As shown, the bottom surface 24 also includes several input/output pads 22. In other words, the top chip 18 in the three dimensional integrated circuit 12 of FIG. 1 includes input/output pads 22 on the upper surface thereof and the bottom chip 18 in the three dimensional integrated circuit 12 of FIG. 1 includes input/output pads 22 on the bottom surface thereof.

In an embodiment, the three dimensional integrated circuit 12 has input/output pads 22 on at least two different planes, sides, surfaces, or faces. In an embodiment, the input/output pads 22 are disposed on opposing faces (e.g., top and bottom) of the three dimensional integrated circuit 12. In an embodiment, the input/output pads 22 are disposed on two different planes (e.g., top and left side, bottom and right side, etc.). In an embodiment, the input/output pads 22 are on parallel, spaced apart planes. In an embodiment, the input/output pads 22 are on perpendicular planes.

The input/output pads 22 in FIGS. 2A-2B are electrically coupled to the components and electrical structures included in the various chips 18 collectively forming the three dimensional integrated circuit 12. Therefore, the signals and functionality provided by the various chips 18 in the three dimensional integrated circuit 12 may be brought into, as well as sent out of, the three dimensional integrated circuit 12.

While the input/output pads 22 of FIGS. 2A-2B are square in shape, the input/output pads 22 may have a variety of other suitable shapes or configurations. By way of example, the input/output pads 22 may be in the shape of a circle, triangle, ellipse or oval, octagon, and so on. In addition, while the input/output pads 22 of FIGS. 2A-2B are equally-spaced around a periphery of the three dimensional integrated circuit 12, other arrangements are contemplated. Indeed, the input/output pads 22 may be positioned proximate the center of the three dimensional integrated circuit 12, at only the corners of the three dimensional integrated circuit 12, in an alternating pattern of pad and no pad around the periphery, at sides but not the center or the corners, or combinations or variations thereof.

While eight of the input/output pads 22 are depicted on each of the top surface 20 and the bottom surface 22 of the three dimensional integrated circuit 12, it should be recognized that more or fewer of the input/output pads 22 may be used in practical applications. In addition, while an equal number of the input/output pads 22 are depicted on both of the top surface 20 and the bottom surface 24 of the three dimensional integrated circuit 12, it should be recognized that the number of input/output pads 22 on the top surface 20 of the three dimensional integrated circuit 12 may disagree with the number of input/output pads 22 on the bottom surface 24 of the three dimensional integrated circuit 12. In an embodiment, the top surface 20 of the three dimensional integrated circuit 12 may have more of the input/output pads 22 than the bottom surface 24. In an embodiment, the bottom surface 24 of the three dimensional integrated circuit 12 may have more of the input/output pads 22 than the top surface 20.

Referring back to FIG. 1, the input/output pads 22 on the top surface 20 of the three dimensional integrated circuit 12 are electrically coupled to corresponding pads on the first fan out structure 14 by electrical connectors 26. Likewise, the input/output pads on the bottom surface 24 of the three dimensional integrated circuit 12 are electrically coupled to corresponding pads on the second fan out structure 16 by electrical connectors 28. In an embodiment, the electrical connectors 26, 28 are solder bumps or other suitable electrical connectors. As shown in FIG. 1, the electrical connectors 26, 28 generally face toward the three dimensional integrated circuit 12 relative to the first and second fan out structures 14, 16.

Still referring to FIG. 1, in an embodiment the first fan out structure 14 includes a substrate 30 and electrical connectors 32. In an embodiment, the substrate 30 is a build-up substrate, a laminate substrate, or some other suitable substrate. In an embodiment, the substrate 30 is an interposer. In an embodiment, the substrate 30 is free or substantially free of active components. In an embodiment, the substrate 30 is a dielectric or other insulating material incorporating sufficient metallization to electrically couple the electrical connectors 26 to the electrical connectors 32.

In an embodiment, the electrical connectors 32 of the first fan out structure 14 comprise a ball grid array (BGA). As shown in FIG. 1, the electrical connectors 32 of the first fan out structure 14 generally face away from the three dimensional integrated circuit 12.

Still referring to FIG. 1, in an embodiment the second fan out structure 16 includes a substrate 34 and electrical connectors 36. In an embodiment, the substrate 34 is a build-up substrate, a laminate substrate, or some other suitable substrate. In an embodiment, the substrate 34 is an interposer. In an embodiment, the substrate 34 is free or substantially free of active components. In an embodiment, the substrate 34 is a dielectric or other insulating material incorporating sufficient metallization to electrically couple the electrical connectors 28 to the electrical connectors 36. In an embodiment, the substrate 34 of the second fan out structure 16 is different than the substrate 30 of the first fan out structure 14.

In an embodiment, the electrical connectors 36 of the second fan out structure 16 comprise a ball grid array (BGA). As shown in FIG. 1, the electrical connectors 36 of the second fan out structure 16 generally face away from the three dimensional integrated circuit 12. In an embodiment, the electrical connectors 36 of the second fan out structure 16 are different than the electrical connectors 32 of the first fan out structure 14.

In an embodiment, a pitch 38 of the electrical connectors 32 from the first fan out structure 14 and a pitch 40 of the electrical connectors 36 from the second fan out structure 16 are each larger or greater than a pitch 42 of the electrical connectors 26 coupled to the top surface 20 of the three dimensional integrated circuit 12 and a pitch 44 of the electrical connectors 28 coupled to the bottom surface 24 of the three dimensional integrated circuit 12.

In an embodiment, the pitch 38 of the electrical connectors 32 from the first fan out structure 14 is different from the pitch 40 of the electrical connectors 36 from the second fan out structure 16. In an embodiment, the pitch 42 of the electrical connectors 26 coupled to the top surface 20 of the three dimensional integrated circuit 12 is different from the pitch 44 of the electrical connectors 28 coupled to the bottom surface 24 of the three dimensional integrated circuit 12.

In an embodiment, the first and second fan out structures 14, 16 may be replaced with fan in or other suitable structures to provide the package 10 with other desirable characteristics and properties. In other words, in an embodiment the pitch 38, 40 of the electrical connectors 38, 40 on the fan out structures 14, 16 may be the same as, or substantially the same as, the pitch 42, 44 of the electrical connectors 26, 28.

Still referring to FIG. 1, a molding compound 46, encapsulant, or other suitable material may be used to protect or encapsulate the three dimensional integrated circuit 12. As shown, the molding compound 46 is generally disposed between the first and second fan out structures 14, 16. In an embodiment, the molding compound 46 extends laterally beyond a periphery of the first and second fan out structures 14, 16. In an embodiment, horizontal surfaces of the molding compound 46 are co-planar with exterior surfaces of the first and second fan out structures 14, 16. Although not shown, an underfill material may be used to protect or encapsulate the electrical connectors 26, 28 disposed between the first and second fan out structures 14, 16 and the three dimensional integrated circuit 12.

Figure 3A:
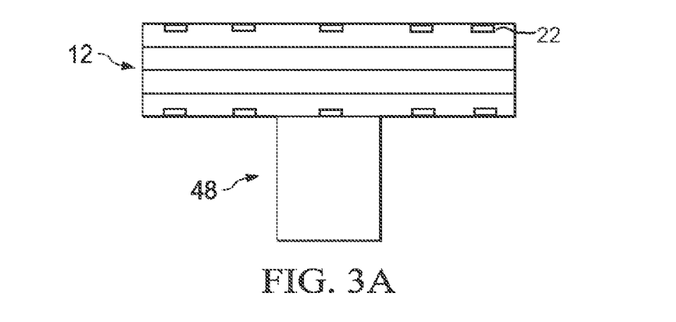
FIGS. 3A-3F collectively schematically illustrate a method of forming the package of FIG. 1.

Referring collectively to FIGS. 3A-3F, a method of forming the package 10 of FIG. 1 is schematically illustrated. As shown in FIG. 3A, the three dimensional integrated circuit 12 is temporarily grasped or seized using a circuit holding device 48 (a.k.a., carrier, grabber, etc.). As shown in FIG. 2A, space between the input/output pads 22 on the top surface 20 was reserved to provide a temporary attachment location for the circuit holding device 48. Indeed, in the embodiment of FIG. 2A, the reserved space comprises the center portion of the top chip 18, which is not occupied by input/output pads 22. In an embodiment, the spaced reserved for the circuit holding device 48 may be different depending on the configuration of the input/output pads 22.

While the circuit holding device 48 of FIG. 3A is depicted as holding or supporting the three dimensional integrated circuit 12 from below, in an embodiment the circuit holding device 48 may suitably hold or secure the three dimensional integrated circuit 12 from above. In such an embodiment, the reserved space comprises the center portion of the bottom chip 18, which is not occupied by input/output pads 22.

Figure 3B:
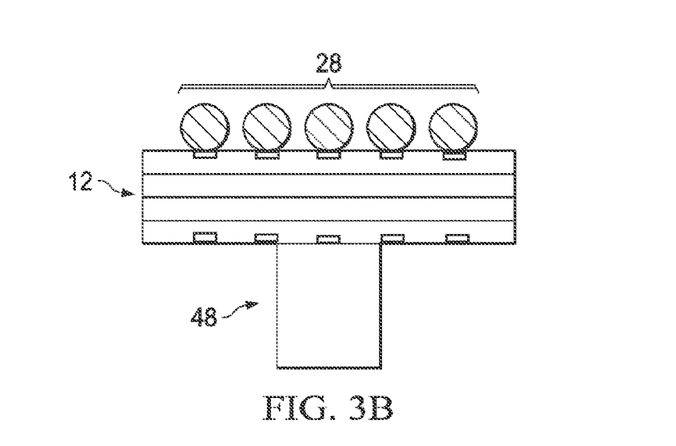
Figure 3C:
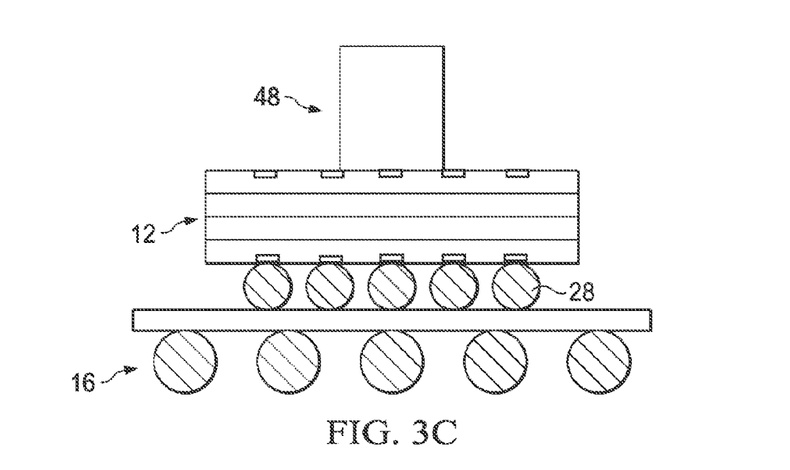

After the three dimensional integrated circuit 12 is secured in place by the circuit holding device 48 as shown in FIG. 3A, the electrical connectors 28 (e.g., solder bumps) are formed on the input/output pads 22 on the reverse side plane of the three dimensional integrated circuit 12 as shown in FIG. 3B. Thereafter, as shown in FIG. 3C, the three dimensional integrated circuit 12 is flipped using the circuit holding device 48.

Once flipped, the three dimensional integrated circuit 12 is mounted to the second fan out structure 16. In an embodiment, the three dimensional integrated circuit 12 is mounted to the second fan out structure 16 by reflowing solder bumps used for the electrical connectors 28. In an embodiment, the second fan out structure 16 comprises a BGA substrate, as described above. As depicted in FIG. 3C, when the three dimensional integrated circuit 12 is mounted to the second fan out structure 16, the front side plane faces upward.

Figure 3D:
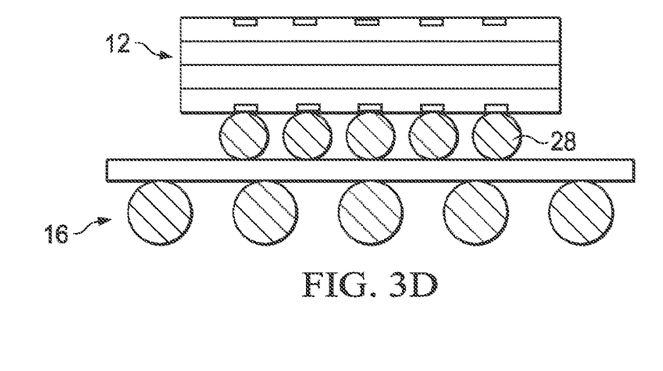
Figure 3E:
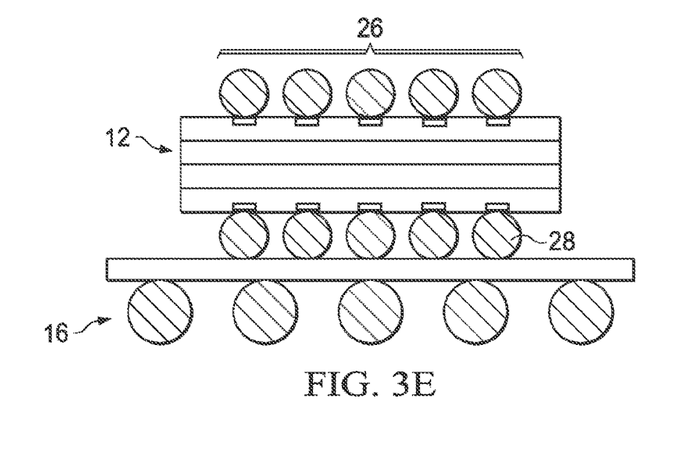
Figure 3F:
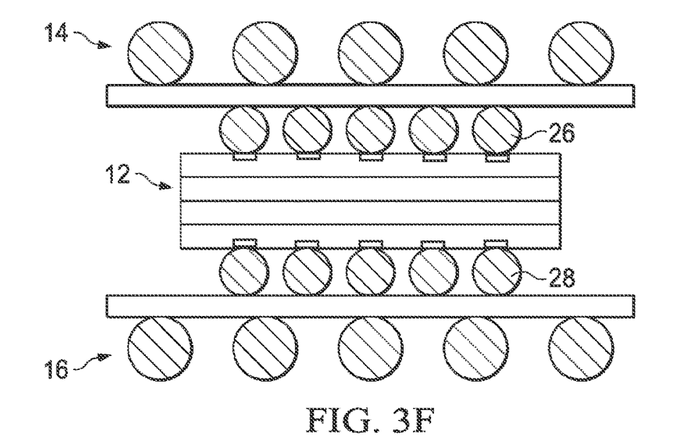

Next, as shown in FIG. 3D, the circuit holding device 48 is removed. With the circuit holding device 48 disengaged from the three dimensional integrated circuit 12, the electrical connectors 26 (e.g., solder bumps) are formed on the input/output pads 22 on the front side plane of the three dimensional integrated circuit 12 as shown in FIG. 3E. Thereafter, as shown in FIG. 3F, the first fan out structure 14 is mounted to the three dimensional integrated circuit 12. In an embodiment, the three dimensional integrated circuit 12 is mounted to the first fan out structure 14 by reflowing solder bumps used for the electrical connectors 26. In an embodiment, the first fan out structure 14 comprises a BGA substrate, as described above.

Finally, as shown in FIG. 1, the molding compound 46 may be introduced between the first and second fan out structures 14, 16 and around the three dimensional integrated circuit 12 to complete the package 10. It should be recognized that other or additional processing steps may be performed to complete or augment the package 10 of FIG. 1 in practical applications. Also, some of the process steps mentioned herein may be optionally omitted from the method. For example, the flipping step may be removed from the fabrication process if a packaging technique other than flip chip style packaging is performed.

From the foregoing, it should be recognized that the embodiment package 10 of FIG. 1 provides numerous advantages and benefits. Indeed, the package 10 includes two-sided bonding. In addition, the package 10 doubles the number of input/outputs available from the three dimensional integrated circuit 12. In addition, the manufacture or fabrication of the package 10 is relatively easy to fabricate. Moreover, the benefits and methodology disclosed herein for the flip chip style package 10 are equally suitable for other similar types of packages.

An embodiment package includes a three dimensional integrated circuit with first input/output pads on a first side and second input/output pads on a second side, a first fan out structure electrically coupled to the first input/output pads on the first side of the three dimensional integrated circuit, and a second fan out structure electrically coupled to the second input/output pads on the second side of the three dimensional integrated circuit.

An embodiment package includes a three dimensional integrated circuit with first input/output pads on a first side and second input/output pads on a second side, a first substrate having first electrical connectors on opposing sides, the first electrical connectors extending toward the three dimensional integrated circuit electrically coupled with the first input/output pads, and a second substrate having second electrical connectors on opposing sides, the second electrical connectors extending toward the three dimensional integrated circuit electrically coupled with the second input/output pads.

An embodiment method of forming a package includes mounting a three dimensional integrated circuit to one side of a first fan out structure, and mounting a second fan out structure on an opposing side of the three dimensional integrated circuit.

In another embodiment, a method of forming a package is provided. The method includes bonding one or more dies forming a chip stack, the chip stack having a first outermost die and a second outermost die opposite the first outermost die, bonding the first outermost die to a first side of a first substrate, a second side of the first substrate having a first set of input/output pads, and bonding the second outermost die to a first side of a second substrate, a second side of the second substrate having a second set of input/output pads In yet another embodiment, a method of forming a package is provided. The method includes bonding a chip stack to a first side of a first substrate, the first side of the first substrate having a first set of contact pads, a second side of the first substrate having a second set of contact pads, and bonding the chip stack to a first side of a second substrate, the first side of the first substrate having a third set of contact pads, a second side of the second substrate having a fourth set of contact pads, the chip stack being interposed between the first substrate and the second substrate.

In yet still another embodiment, a package is provided. The package includes a first substrate, a first side of the first substrate having a first set of conductive features and a second side of the first substrate having a second set of conductive features, and a second substrate, a first side of the second substrate having a third set of conductive features and a second side of the second substrate having a fourth set of conductive features. The package further includes a chip stack interposed between the first substrate and the second substrate, a first side of the chip stack having a fifth set of conductive features and a second side of the chip stack having a sixth set of conductive features, the fifth set of conductive features being coupled to the first set of conductive features, the sixth set of conductive features being coupled to third set of conductive features.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a package, the method comprising:
   bonding one or more dies forming a chip stack, the chip stack having a first outermost die and a second outermost die opposite the first outermost die, the first outermost die being electrically coupled to the second outermost die;
   after forming the chip stack, bonding a first set of input/output pads of the first outermost die to a first side of a first substrate using a first set of connectors, a second side of the first substrate having second set of connectors; and
   bonding a second set of input/output pads of the second outermost die to a first side of a second substrate using a third set of connectors, a second side of the second substrate having a fourth set of connectors, wherein a pitch of the first set of connectors is different from a pitch of the third set of connectors, wherein the first substrate is electrically coupled to the second substrate only through the first set of connectors, the third set of connectors, and the chip stack.

2. The method of claim 1, further comprising forming a molding compound adjacent the chip stack.

3. The method of claim 2, wherein forming the molding compound is performed after bonding the first outermost die to the first side of the first substrate and bonding the second outermost die to the first side of the second substrate.

4. The method of claim 3, wherein the molding compound extends from the first substrate to the second substrate.

5. The method of claim 1, wherein the first set of input/output pads is arranged in an array.

6. The method of claim 5, wherein the second set of input/output pads is arranged in an array.

7. A method of forming a package, the method comprising:
   bonding a first side of a chip stack to a first side of a first substrate, the first side of the chip stack having a first set of contact pads, a second side of the first substrate having a first set of connectors, the second side of the first substrate being opposite the first side of the first substrate, wherein the chip stack comprises a plurality of chips bonded to each other, and wherein adjacent ones of the plurality of chips are electrically coupled before bonding the chip stack to the first side of the first substrate; and
   after bonding the first side of the chip stack to the first side of the first substrate, bonding a second side of the chip stack to a first side of a second substrate, the second side of the chip stack being opposite the first side of the chip stack, the second side of the chip stack having a second set of contact pads, a second side of the second substrate having a second set of connectors, the second side of the second substrate being opposite the first side of the second substrate, the first side of the first substrate facing the first side of the second substrate, a pitch of the first set of connectors being different from a pitch of the second set of connectors, a pitch of the first set of contact pads being different from a pitch of the second set of contact pads, the chip stack being interposed between the first substrate and the second substrate, the first substrate being electrically coupled to the second substrate only through a single electrical path comprising the chip stack.

8. The method of claim 7, wherein the pitch of the first set of contact pads is less than the pitch of the first set of connectors.

9. The method of claim 7, wherein the pitch of the second set of contact pads is less than the pitch of the second set of connectors.

10. The method of claim 7, wherein the chip stack is bonded to the first substrate using first solder balls.

11. The method of claim 10, wherein the chip stack is bonded to the second substrate using second solder balls.

12. The method of claim 7, wherein after bonding the chip stack to the first substrate and the second substrate, forming a molding compound between the first substrate and the second substrate.

13. The method of claim 7, wherein the pitch of the first set of connectors is different from the pitch of the first set of contact pads.

14. A package comprising:
    a first substrate, the first substrate having a first side and a second side, the first side of the first substrate being opposite the second side of the first substrate, the second side of the first substrate having a first set of connectors;
    a second substrate, the second substrate having a first side and a second side, the first side of the second substrate being opposite the second side of the second substrate, the second side of the second substrate having a second set of connectors, wherein a pitch of the first set of connectors is different from a pitch of the second set of connectors; and
    a chip stack interposed between the first substrate and the second substrate, a first side of the chip stack having a first set of conductive features and a second side of the chip stack having a second set of conductive features, the first set of conductive features being coupled to the first side of the first substrate using a third set of connectors, the second set of conductive features being coupled to the first side of the second substrate using a fourth set of connectors, wherein a pitch of the third set of connectors is different from a pitch of the fourth set of connectors, wherein the chip stack comprises a plurality of chips bonded to each other, wherein adjacent ones of the plurality of chips are directly electrically coupled, and wherein the first substrate is electrically coupled to the second substrate only through the third set of connectors, the fourth set of connectors, and the chip stack.

15. The package of claim 14, wherein a perimeter of the third set of connectors is less than a perimeter of the first set of connectors.

16. The package of claim 14, wherein a perimeter of the fourth set of connectors is less than a perimeter of the second set of connectors.

17. The package of claim 14, wherein the first substrate is an interposer.

18. The package of claim 14, wherein the pitch of the third set of connectors is less than the pitch of the first set of connectors.

19. The package of claim 14, wherein the pitch of the fourth set of connectors is less than the pitch of the second set of connectors.

20. The package of claim 14, wherein the pitch of the first set of connectors is greater than the pitch of the third set of connectors and the pitch of the fourth set of connectors.

* * * * *